United States Patent
Lange

(10) Patent No.: US 7,361,977 B2
(45) Date of Patent: Apr. 22, 2008

(54) SEMICONDUCTOR ASSEMBLY AND PACKAGING FOR HIGH CURRENT AND LOW INDUCTANCE

(75) Inventor: Bernhard P. Lange, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 23 days.

(21) Appl. No.: 11/204,645

(22) Filed: Aug. 15, 2005

(65) Prior Publication Data

US 2007/0034993 A1    Feb. 15, 2007

(51) Int. Cl.
*H01L 23/495* (2006.01)
*H01L 23/52* (2006.01)
*H01L 29/40* (2006.01)
*H01L 23/48* (2006.01)

(52) U.S. Cl. .................. 257/674; 257/666; 257/784; 257/669; 257/E23.043

(58) Field of Classification Search ............ 257/666, 257/674, 784, 669, E23.043
See application file for complete search history.

(56) References Cited

U.S. PATENT DOCUMENTS

| | | | | |
|---|---|---|---|---|
| 5,394,008 A | * | 2/1995 | Ito et al. | 257/666 |
| 5,648,681 A | * | 7/1997 | Takashima et al. | 257/666 |
| 5,751,057 A | * | 5/1998 | Palagonia | 257/691 |
| 2003/0042583 A1 | * | 3/2003 | Chen et al. | 257/666 |

* cited by examiner

*Primary Examiner*—Nitin Parekh
(74) *Attorney, Agent, or Firm*—Yingsheng Tung; Wade James Brady, III; Frederick J. Telecky, Jr.

(57) ABSTRACT

A device comprising a semiconductor chip (110) having a side edge (111) and a plurality of metal bond pads (120, 121) near the edge; the pads are aligned to form rows (130, 131) parallel to the edge. The device further includes a leadframe (100) having leads (140 . . . ) oriented with one end (140a . . . ) towards the chip edge and spaced from it by a gap (150); the chip is attached to the leadframe. Ends of selected leads are connected by a metal cross bar (160) parallel to the chip edge. Substantially parallel bond wires (170) are crossing the gap to connect each chip pad either to the crossbar or to a non-selected lead end. In a preferred lead arrangement, the selected leads alternate with non-selected leads.

10 Claims, 3 Drawing Sheets

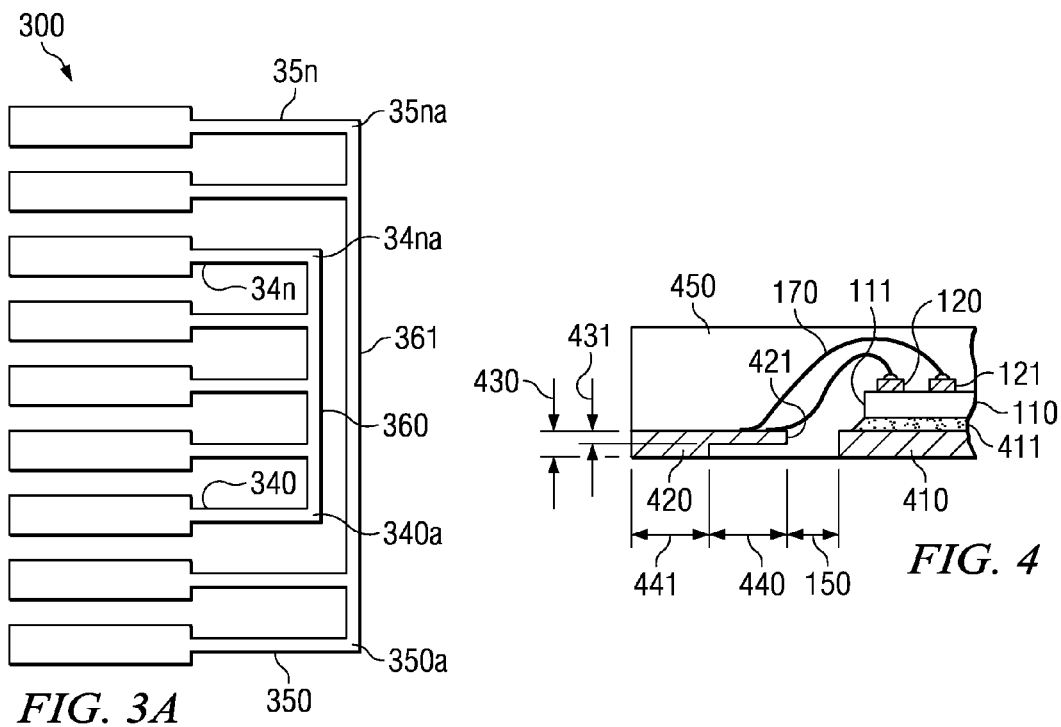
FIG. 3A
FIG. 4
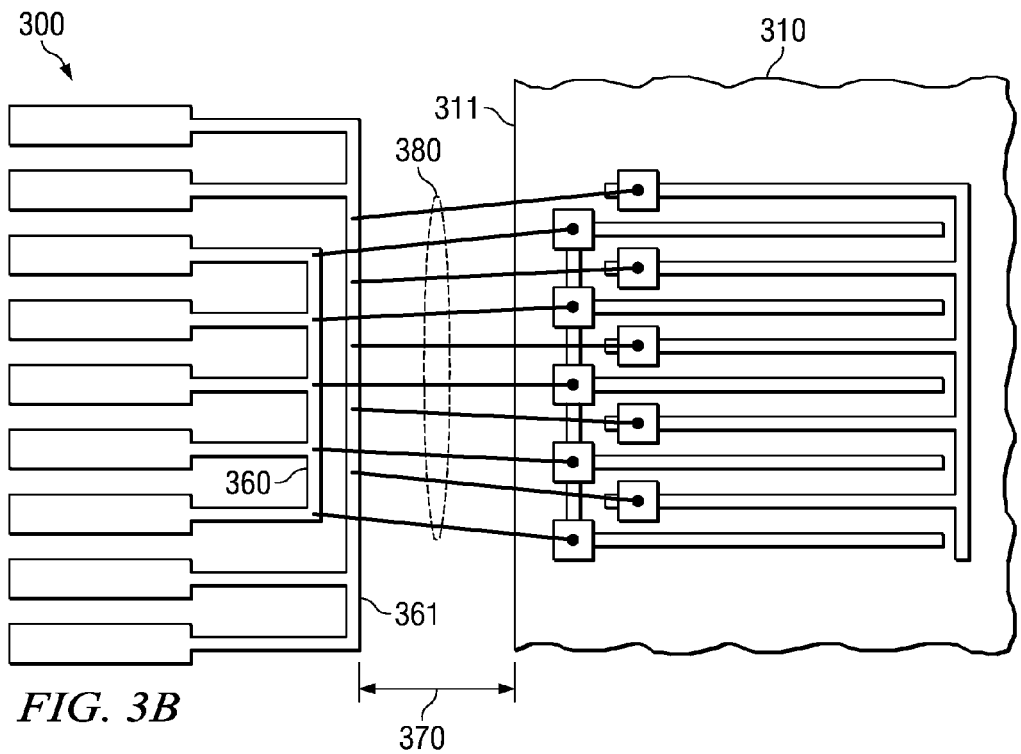
FIG. 3B

SEMICONDUCTOR ASSEMBLY AND PACKAGING FOR HIGH CURRENT AND LOW INDUCTANCE

FIELD OF THE INVENTION

The present invention is related in general to the field of semiconductor devices and processes and more specifically to high performance wire bonded semiconductor devices, which can provide high power, low noise, and high speed at a cost lower than flip-chip devices.

DESCRIPTION OF THE RELATED ART

Two of the ongoing trends in integrated circuit (IC) technology are the drives towards higher integration and shrinking component feature sizes. Higher levels of integration include the need for higher numbers of signal lines and power lines, yet smaller feature sizes make it more and more difficult to preserve clean signals without mutual interference. In addition, with increasing signal frequencies, transmission and shielding of signals require careful attention.

These trends and requirements do not only dominate the semiconductor chips, which incorporate the ICs, but also the packages, which house and protect the IC chips. Actually, boards and other parts of an electronic product have to be included in these considerations as a system.

The growing popularity of flip-chip assembly in the fabrication process flow of silicon integrated circuit (IC) devices is driven by several facts. First, the electrical performance of the semiconductor devices can commonly be improved when the parasitic inductances correlated with conventional wire bonding interconnection techniques are reduced. Second, flip-chip assembly often provides higher interconnection densities between chip and package than wire bonding. Third, in many designs flip-chip assembly consumes less silicon "real estate" than wire bonding, and thus helps to conserve silicon area and reduce device cost. And fourth, the fabrication cost can often be reduced, when concurrent gang-bonding techniques are employed rather than consecutive individual bonding steps. The conventional fabrication process uses solder balls, or bumps, and their reflow technique as the standard method of ball bonding.

While flip-chip assembled devices look technically superior, flip-chip assembled devices are more expensive than wire bonded devices. Cost/performance sensitive products cannot compete with lower performance devices. Product managers demand the higher performance of flip-chip assembled products, but they also demand the lower cost of wire-bonded devices. Among the technical drawbacks of wire-bonded devices are the higher electrical resistance and the higher inductance of the wire.

SUMMARY OF THE INVENTION

Applicant recognizes a need to develop a technical approach which combines the low cost advantage of wire bonded assembly with the advantage of superior technical characteristics such as minimum inductance and noise—prerequisites of high speed—and reduced electrical resistance suitable for high power. The low-cost method of assembling high lead count devices should provide excellent electrical performance, especially speed and power, mechanical stability, and high product reliability. The fabrication method should be flexible enough to be applied for different semiconductor product families, including substrates, and a wide spectrum of design and process variations.

One embodiment of the invention is a device comprising a semiconductor chip having a side edge and a plurality of metal bond pads near the edge; the pads are aligned to form rows parallel to the edge. The device further includes a leadframe having leads oriented with one end towards the chip edge and spaced from it by a gap; the chip is attached to the leadframe. Ends of selected leads are connected by a metal cross bar parallel to the chip edge. Substantially parallel bond wires are crossing the gap to connect each chip pad either to the crossbar or to a non-selected lead end.

In a preferred lead arrangement, the selected leads alternate with non-selected leads.

In another preferred lead arrangement, adjacent non-selected leads are framed by pluralities of selected leads.

Another embodiment of the invention is a device comprising a semiconductor chip having a side edge and a plurality of metal bond pads near the edge; the pads are aligned to form rows parallel to the edge. The device further includes a leadframe having leads oriented with one end towards the chip edge and spaced from it by a gap; the chip is attached to the leadframe. Ends of a first plurality of selected leads are connected by a first metal crossbar parallel to the chip edge. Ends of a second plurality of selected leads are connected by a second metal crossbar parallel to the chip edge. Substantially parallel bond wires are crossing the gap to connect each chip pad either to the first crossbar or to the second crossbar or to a non-selected lead end.

The embodiments of the invention offer the opportunity to transport electrical current through more than one connecting wire, thus providing for the transport of high amounts of current. Further, respective pairs of wire are substantially parallel aligned their entire length; consequently, the effective inductance (and thus noise) between corresponding wires is diminished. Examples for the electrical current include power and ground, and signal and ground. Additional reduction in inductance can be realized by providing the shortest possible wire bonds possible by bonding from the chip pads at the edge of the chip to the crossbars of the leadframe. In addition, multiple wire bonds can be used in an arrangement to take advantage of coupling power and ground wires.

Technical advantages of the invention are its simplicity and low cost so that it can be easily adopted into any integrated circuit.

Another technical advantage of the invention is its universal application, especially for high speed integrated circuits.

Another technical advantage of the invention is its broad application to leadframe designs; actually, the invention can also be applied to leadless packages and to BGA-compatible substrates.

The technical advances represented by certain embodiments of the invention will become apparent from the following description of the preferred embodiments of the invention, when considered in conjunction with the accompanying drawings and the novel features set forth in the appended claims.

BRIEF DESCRIPTION OF THE DRAWINGS

FIG. 3A shows a schematic top view of a portion of a leadframe according to another embodiment of the invention.

FIG. 3B shows a schematic top view of the same portion of a leadframe as FIG. 3A, connected by bonding wires to the contact pads of a chip.

FIG. 4 is a schematic cross section of portions of leadframe and assembled chip in a QFN molded package embodiment to illustrate exposed metal parts.

DETAILED DESCRIPTION OF THE PREFERRED EMBODIMENTS

Recent semiconductor device applications, especially voltage supply applications, require high switching current features by the semiconductor chip. In addition, the electrical noise level is to be kept as small as possible, requiring low inductance. Further, the package dimensions are to be kept small, since in most device applications, available space is at a premium. And as so often in semiconductor technology, the device and fabrication cost needs to be kept as low as possible.

Figure 1A:
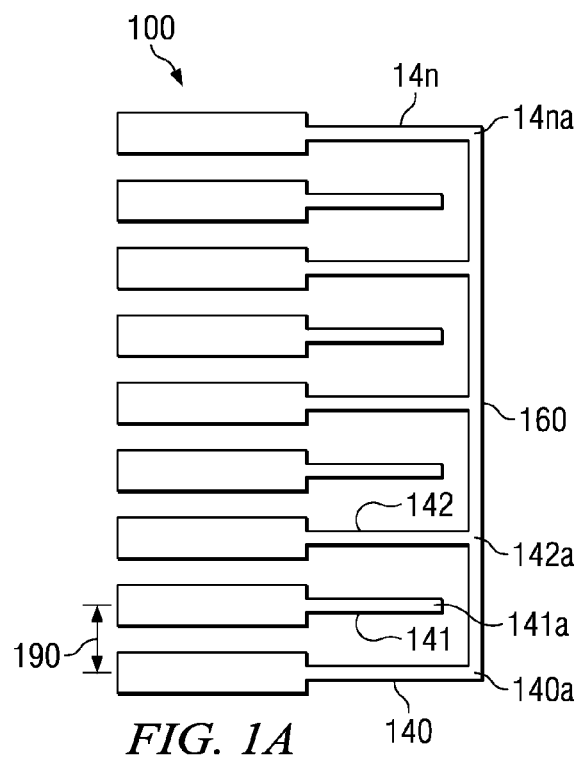
FIG. 1A depicts a schematic top view of a portion of a leadframe according to an embodiment of the invention.
Figure 1B:
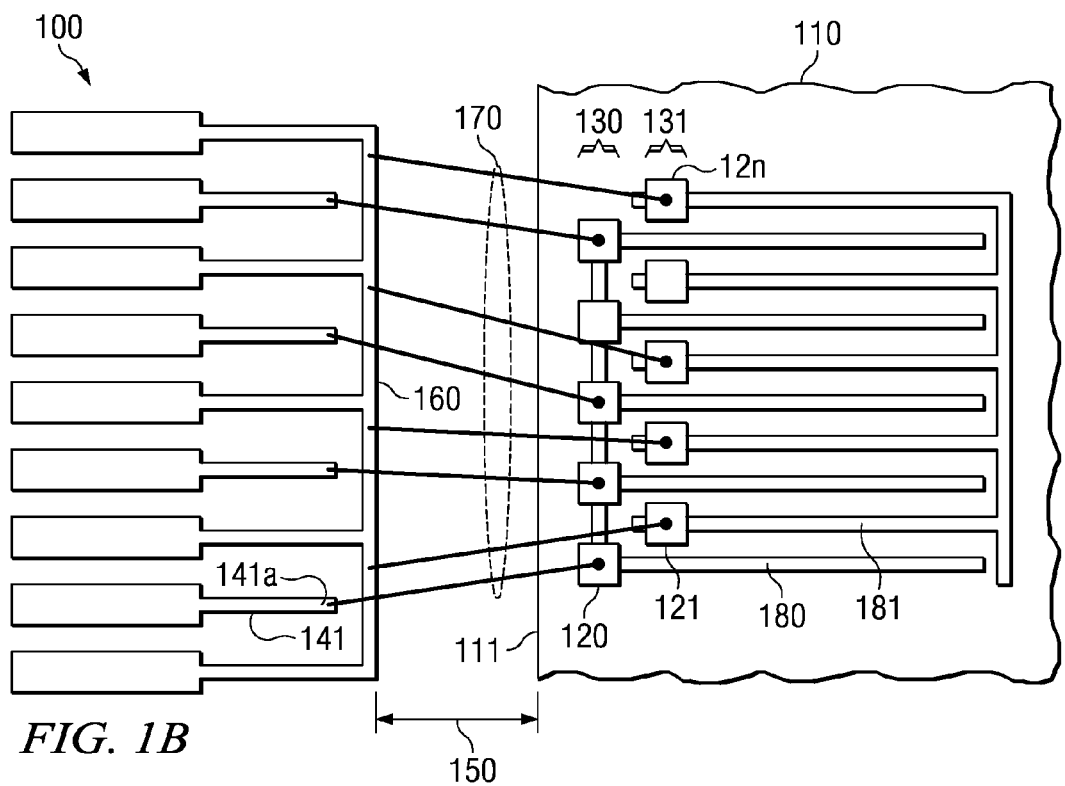
FIG. 1B depicts a schematic top view of the same portion of a leadframe as FIG. 1A, connected by bonding wires to the contact pads of a chip.

FIGS. 1A and 1B illustrate an embodiment of the present invention, which fulfills these design requirements. FIG. 1A is a top view of a portion of the leads of a leadframe, generally designated 100, and FIG. 1B is a top view of the same leadframe portion in conjunction with the respective portion of the bond pads of a chip; the chip portion is designated 110. The chip has a side edge 111 and a plurality of metal bond pads 120, 121 ... 12n near edge 111. The pads are aligned to form rows 130 and 131 parallel to edge 111. The metal of bond pads is selected so that the metal, or at least the top surface of the metal, is reliably bondable, especially by gold wires; examples of such pad metals are aluminum or gold.

The starting material of the semiconductor chip is frequently silicon or silicon germanium, especially for integrated circuits. The invention is, however, also applicable to chips made of gallium arsenide, other III-V or II-VI compound, or any other semiconductor material used in manufacturing, or to insulating substrate materials, which are involved in wire bonding connections to conducting leads. The circuit portion shown for chip 110 in FIG. 1B illustrates only schematically lines 180 and 181 of the power circuit of chip 110.

Referring now to FIG. 4, it can be seen that chip 110 is attached to the chip pad 410 of the leadframe using an adhesive attach material 411 (typically an epoxy or polyimide).

FIGS. 1A and 1B illustrate a portion 100 of the leadframe. Portion 100 has leads 140, 141 ... 14n. These leads are oriented with one end 140a, 141a ... 14na towards chip edge 111; they are spaced from edge 111 by a gap 150 (see FIG. 1B). In many device examples, the pitch 190 center-to-center of the leads is preferably between 0.3 and 0.8 mm.

In the leadframe portion 100, the ends 140a, 142a, ..., 14na of selected leads 140, 142, ..., 14n are connected by a metal cross bar 160, which is parallel to chip edge 111. In other words, in the example of FIGS. 1A and 1B, when counting the leads, all leads with even numbers are connected by metal cross bar 160.

A preferred material for the whole leadframe including portion 100 and the chip pad 410 is copper or a copper alloy. A typical leadframe thickness range is from about 120 to 250 μm; however, some devices may require thinner, or thicker, materials (for certain portions of the leads, especially in QFN packages, the thickness may be etched back to about 75 to 100μ in order to limit the exposure for external soldering; this feature is discussed in conjunction with FIG. 4). For easy and cost-effective manufacturing, it has been common practice to produce leadframes from sheets of material and stamp or etch the desired shape. Further, to support leadframe adhesion to molding compounds, to improve external lead solderability, or to enhance other characteristics or processes such as wire stitch attach, portions of the copper may be plated with another metal layer such as nickel, palladium, tin, or silver.

FIG. 1B illustrates substantially parallel bond wires 170 crossing gap 150 to connect each chip pad (for instance 120 and 121) either to crossbar 160 or to a non-selected lead end 141a. In order to reach a non-selected lead end without electrical short, the wire has to span the crossbar. In the embodiment of FIG. 1B, adjacent pairs of wires 170 are substantially parallel to each other; FIGS. 2B and 3B show embodiments wherein larger groups of wires are approximately parallel to each other. The length of the wires depends on the chip size and the proximity of the leadframe to the chip. For a Quad Flat, No-Lead (QFN) device as exemplified in FIG. 4, the illustrations of FIGS. 1B, 2B, and 3B indicate a preferred wire length of about 1000 to 1500 μm.

A preferred application of the parallelism of bond wire pairs 170 in FIG. 1B are power circuits, wherein one group of wires, such as the wires attached to pad row 130, is used to transport "current in", and the other group of wires, such as the wires attached to pad row 131, is used to transport "current out". Examples include power and ground, and signal and ground. The embodiment of FIG. 1B offers two advantages: Multiple wires provide high current capability, and the parallelism provides low effective inductance (and thus low noise) between corresponding wires.

Figure 2A:
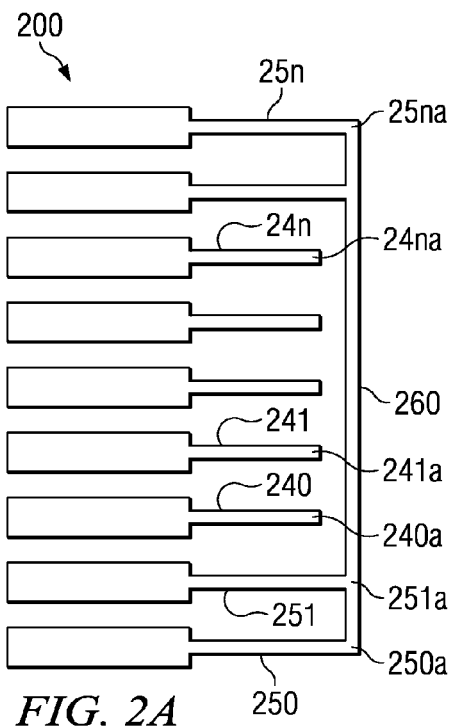
FIG. 2A illustrates a schematic top view of a portion of a leadframe according to another embodiment of the invention.
Figure 2B:
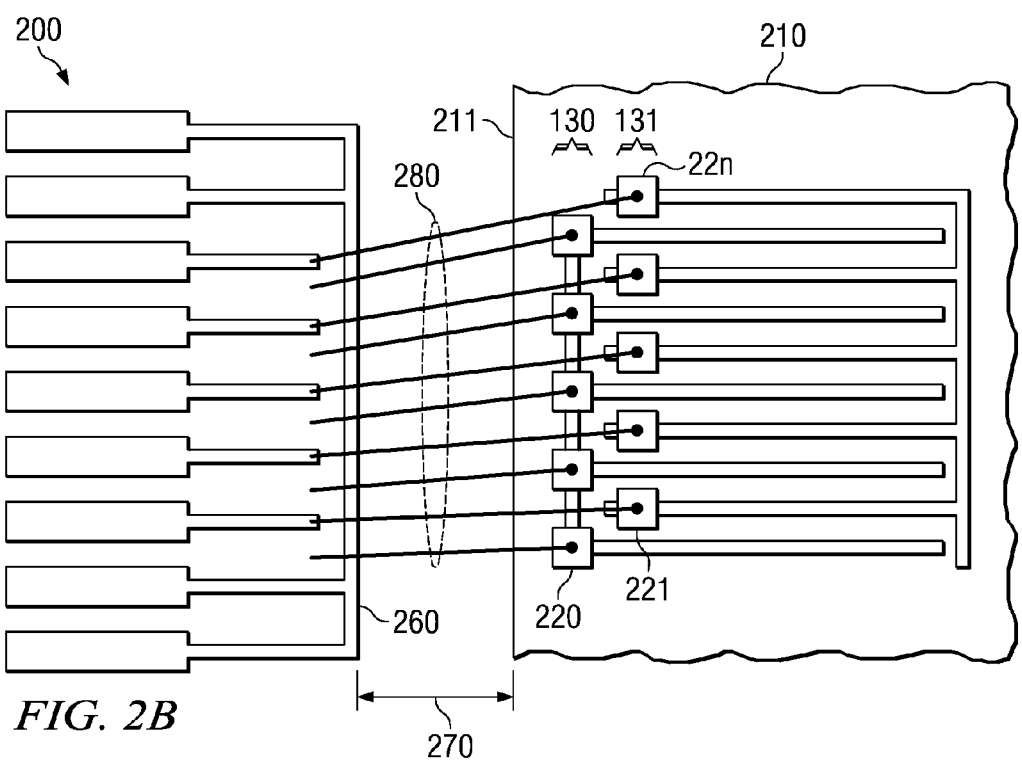
FIG. 2B illustrates a schematic top view of the same portion of a leadframe as FIG. 2A, connected by bonding wires to the contact pads of a chip.

FIGS. 2A and 2B illustrate another embodiment of the invention. The leads of leadframe portion 200 are grouped so that a group of adjacent non-selected leads 240, 241, ... 14n are framed by pluralities of selected leads 250, 251, ..., 25n. The ends 240a ... 24na of the non-selected leads are oriented towards chip edge 211 in FIG. 2B, and the selected lead ends 250a ... 25na are connected by a metal crossbar 260.

An arrangement of the leads as shown in leadframe portion 200 enables a particularly effective parallelism of bonding wires in device assembly. FIG. 2B depicts a chip portion designated 210 with metal bond pads. The chip has a side edge 211; the plurality of bond pads 220, 221 ... 22n is near edge 211. The pads are aligned to form rows 230 and 231, parallel to edge 211. Edge 211 is spaced from lead crossbar 260 by gap 270.

FIG. 2B illustrates substantially parallel bond wires 280 crossing gap 270 to connect each chip pad (for instance 220 and 221) either to crossbar 260 or to a non-selected lead end 240a, ... In order to reach a non-selected lead end without electrical short, the wire has to span the crossbar. Multiple wires provide high current capability, and the parallelism of the bond wires provides low effective inductance and thus low noise.

FIGS. 3A and 3B illustrate yet another embodiment of the invention, with FIG. 3A depicting leadframe portion 300, and FIG. 3B depicting the assembly of chip portion 310, with chip side edge 311, and leadframe 300. In the leadframe, the ends 340a . . . 34na of a first plurality of selected leads 340 . . . 34n are connected by a first metal crossbar 360. As FIG. 3B shows, crossbar 360 is parallel to chip edge 311. Further in the leadframe, the ends 350a . . . 35na of a second plurality of selected leads 350 . . . 35n are connected by a second metal crossbar 361. As FIG. 3B shows, crossbar 361 is parallel to chip edge 311. There is a gap 370 between crossbar 361 and chip edge 311.

Substantially parallel bond wires 380 are crossing the gap 370 to connect each chip pad either to the first crossbar 360 or to the second crossbar 361. In devices, which have leftover non-selected lead ends, bond wires, which are parallel to each other and to the above mentioned groups of wires, cross gap 370 to connect the respective chip pads the non-selected lead ends.

The invention is applicable to leadframes for leaded packages as well as to leadframes for leadless packages. An example of a Quad-Flat-No-lead device is schematically illustrated in the cross section of FIG. 4. Chip 110 is attached by adhesive material 411 on the chip pad 410 of the leadframe. Chip 110 has metal bond pads 120 and 121 located near the chip edge 111. The leadframe has further leads 420 with one end 421 oriented towards chip edge 111; lead end 421 is spaced from chip edge 111 by gap 150. Bond wires 170 are crossing the gap 150 to connect chip pads 120 and 121 to one of the leads 420, respectively.

The original thickness of lead 420 is designated 430. However, for a portion 440 of the lead length (approximately half the length), thickness 430 has been reduced, preferably by etching. The reduced thickness is designated 431. As an example, for an original thickness between about 150 and 200µ, the reduced thickness is preferably between about 75 and 100µ. The lead length of reduced thickness may further exhibit reduced width, as schematically illustrated in the leadframe examples of FIGS. 1A to 3B.

After encapsulating the device in protective plastic 450, for instance using molding compound, the lead length 440 of reduced thickness serves as an anchor for the plastic. The additional lead surface enhances adhesion and helps preventing delamination of the package.

On the other hand, the remaining lead length 441, with the original thickness 430, provides electrical contact to external parts and also serves, in addition to chip pad 410, as attachment surface, either by pressure contact or by soldering. For the latter technique, lead length 441 is receiving a surface, which is wettable and solderable (for example, a thin layer of gold or palladium)

In addition to leadframes, the invention is applicable to many insulating substrates, which have conducting lines and contact pads. These lines and contact pads can be designed according to the teachings of the invention analogous to the leadframe description above to create appropriate attachment sites for connecting wires so that the wires become substantially parallel to each other and numerous wires are available for transporting high current.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications.

I claim:

1. A device comprising:
    a semiconductor chip having a side edge and a plurality of metal bond pads near the edge, the pads aligned to form rows parallel to the edge;
    a metallic leadframe having leads with a first end adjacent the chip edge and spaced from it by a gap, the chip attached to the leadframe;
    a first metal crossbar between the chip edge and the leads, connecting a plurality of first selected leads;
    a second metal crossbar between the first metal crossbar and the chip edge, connecting a plurality of second selected leads adjacent the first selected leads; and
    bond wires connecting the bond pads to the second crossbar.

2. The device according to claim 1, in which the leads have a second end distant from the edge of the chip.

3. The device according to claim 2, in which the first end of the leads has a first thickness and the second end of the leads has a second thickness greater than the first thickness.

4. A device comprising:
    a semiconductor chip having a side edge and a structure with two groups of inter-digitating lines, a first group of lines connected to a first group of metal bond pads and a second group of lines connected to a second group of bond pads, the pads aligned to form rows parallel to the edge; the chip attached to a leadframe;
    the leadframe having leads with one end near the chip edge and spaced from it by a gap, and a first metal crossbar between the chip edge and the leads connecting a first group of leads; and
    bond wires connecting the first group of bond pads to the first crossbar.

5. The device according to claim 4 further comprising a second crossbar parallel the first crossbar connecting a second group of leads adjacent the first group of leads.

6. The device according to claim 4, further comprising a second group of bond wires connecting the second group of lines to the second group of leads.

7. The device according to claim 6, in which the second group of bond wires are bonded on the end of a second group of leads adjacent the first group of leads.

8. A device comprising:
    a semiconductor chip having a side edge and a structure with two groups of inter-digitating lines, a first group of lines connected to a first group of metal bond pads and a second group of lines connected to a second group of bond pads, the pads aligned to form rows parallel to the edge; the chip attached to an insulating substrate;
    the insulating substrate having metallic leads with one end near the chip edge and spaced from it by a gap, and a first metal crossbar between the chip edge and the leads connecting a first group of leads; and
    bond wires connecting the first group of bond pads to the first crossbar.

9. The device according to claim 8 further comprising a second crossbar parallel the first crossbar connecting a second group of leads adjacent the first group of leads.

10. The device according to claim 8, further comprising a second group of bond wires connecting the second group of lines to the second group of leads.

* * * * *